(12) United States Patent
Gruening-Von Schwerin et al.

(10) Patent No.: US 7,452,821 B2
(45) Date of Patent: Nov. 18, 2008

(54) METHOD FOR THE FORMATION OF CONTACT HOLES FOR A NUMBER OF CONTACT REGIONS FOR COMPONENTS INTEGRATED IN A SUBSTRATE

(75) Inventors: Ulrike Gruening-Von Schwerin, Munich (DE); Wolfgang Gustin, Anzing (DE); Klaus-Dieter Morhard, Dresden (DE)

(73) Assignee: Infineon Technologies AG, Munich (DE)

( * ) Notice: Subject to any disclaimer, the term of this patent is extended or adjusted under 35 U.S.C. 154(b) by 278 days.

(21) Appl. No.: 10/479,733

(22) PCT Filed: Apr. 18, 2002

(86) PCT No.: PCT/EP02/03349

§ 371 (c)(1),
(2), (4) Date: Jun. 2, 2004

(87) PCT Pub. No.: WO02/101814

PCT Pub. Date: Dec. 19, 2002

(65) Prior Publication Data

US 2004/0206722 A1  Oct. 21, 2004

(30) Foreign Application Priority Data

Jun. 8, 2001 (DE) .................................. 101 27 888

(51) Int. Cl.
*H01L 21/302* (2006.01)
(52) U.S. Cl. .................................... 438/704; 216/57
(58) Field of Classification Search .............. 438/700, 438/704

See application file for complete search history.

(56) References Cited

U.S. PATENT DOCUMENTS 4,726,879 A * 2/1988 Bondur et al. ............... 438/712

(Continued)

FOREIGN PATENT DOCUMENTS

DE 196 29 736 7/1997

(Continued)

OTHER PUBLICATIONS

Wolf et al., Silicon Processing for the VLSI Era, 1986, Lattice Press, vol. 1, pp. 175, 384-385, 399, 427-428.*

(Continued)

*Primary Examiner*—Keith D. Hendricks
*Assistant Examiner*—Patricia A George
(74) *Attorney, Agent, or Firm*—Dicke, Billig & Czaja, PLLC

(57) ABSTRACT

A method is disclosed by means of which contact holes (K1), (K2) and (K3), leading to integrated components can be produced with just one structuring mask, whereby contact holes (K1) and (K3) lead to contact regions (25e, 45e) in the substrate (5) and contact holes (K2) lead to contact regions (35c, 50c) located on layer stacks (35, 50). An auxiliary layer is used for the etching of contact holes (K1), (K2), (K3), which covers a part of the contact holes and thus serves as a selection mask. The auxiliary layer can be structured with a low-resolution lithography in comparison with the mask, such that only one single high-resolution lithography is necessary for the formation of all contact holes (K1), (K2), (K3). The method is particularly suitable for the simultaneous production of contact holes for transistors in the cell field and the logic field of a DRAM.

22 Claims, 6 Drawing Sheets

U.S. PATENT DOCUMENTS

| | | |
|---|---|---|
| 5,091,339 A | 2/1992 | Carey |
| 5,298,463 A | 3/1994 | Sandhu et al. |
| 5,306,624 A * | 4/1994 | Roelant ............... 435/39 |
| 5,792,703 A | 8/1998 | Bronner et al. |
| 5,830,624 A * | 11/1998 | Bae et al. ............... 430/323 |
| 5,922,515 A * | 7/1999 | Chiang et al. ............ 430/312 |
| 5,966,632 A | 10/1999 | Chen et al. |
| 6,008,119 A * | 12/1999 | Fournier ............... 438/633 |
| 6,048,763 A * | 4/2000 | Doan et al. ............ 438/239 |
| 6,091,154 A | 7/2000 | Ohkawa |
| 6,104,052 A | 8/2000 | Ozaki |
| 6,130,449 A * | 10/2000 | Matsuoka et al. ......... 257/296 |
| 6,255,161 B1 | 7/2001 | Lin |
| 6,429,067 B1 * | 8/2002 | Liu et al. ............... 438/241 |
| 6,497,993 B1 * | 12/2002 | Chiu et al. ............. 430/313 |
| 6,696,222 B2 * | 2/2004 | Hsue et al. ............. 430/313 |
| 2004/0127037 A1 * | 7/2004 | Lee ............... 438/689 |

FOREIGN PATENT DOCUMENTS

| | | |
|---|---|---|
| TW | 329044 | 4/1998 |
| TW | 387104 B | 4/2000 |

OTHER PUBLICATIONS

Streetman, Solid State Electronic Devices, 1990, Prentice Hall, 3rd ed., p. 300-301.*

Wolf et al. Silicon processing for the VLSI ERA, 1986, Lattice press, vol. 1, pp. 175, 384-385, 399, 427-428.*

Streetman, Solid State Electronic Devices, 1990, Prentice hall, 3rd Ed., p. 300-301.*

Wolf et al. (Silicon Processing for the VLSI Era; vol. 1; 1986; Lattice Press) et al.*

Streetman, Solid State Electronic Devices, 1990, Prentice hall, 3$^{rd}$ Ed., p. 300-301.*

Gabriel et al. (Journal of Vacuum Science & Technology A: Vacuum, Surfaces, and Films—Jul. 2000—vol. 18, Issue 4, pp. 1420-1424).*

* cited by examiner

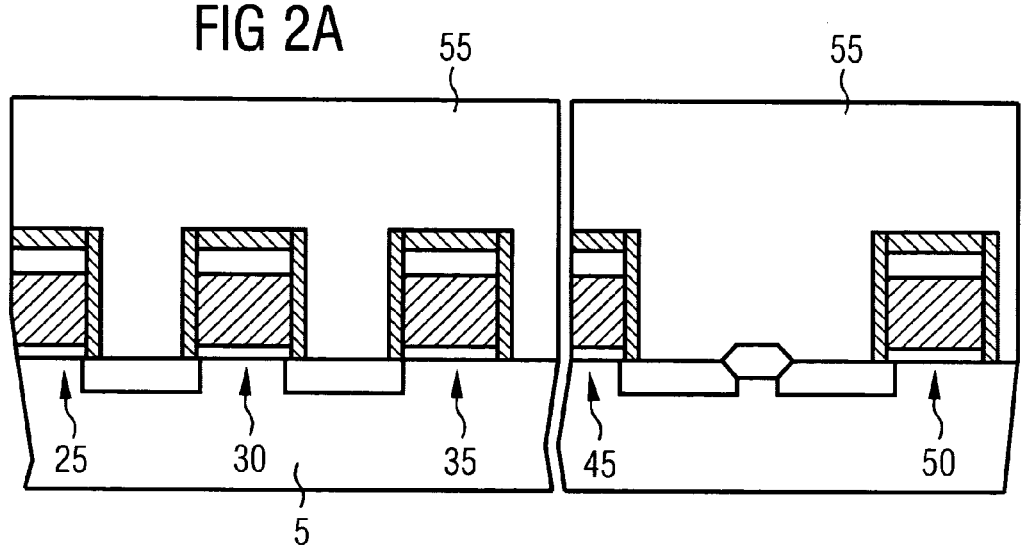
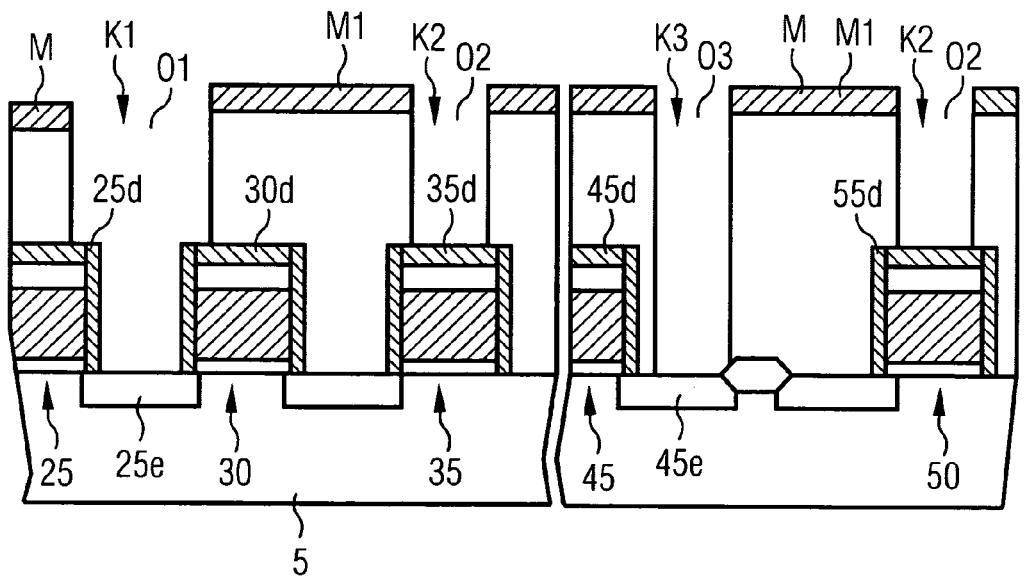

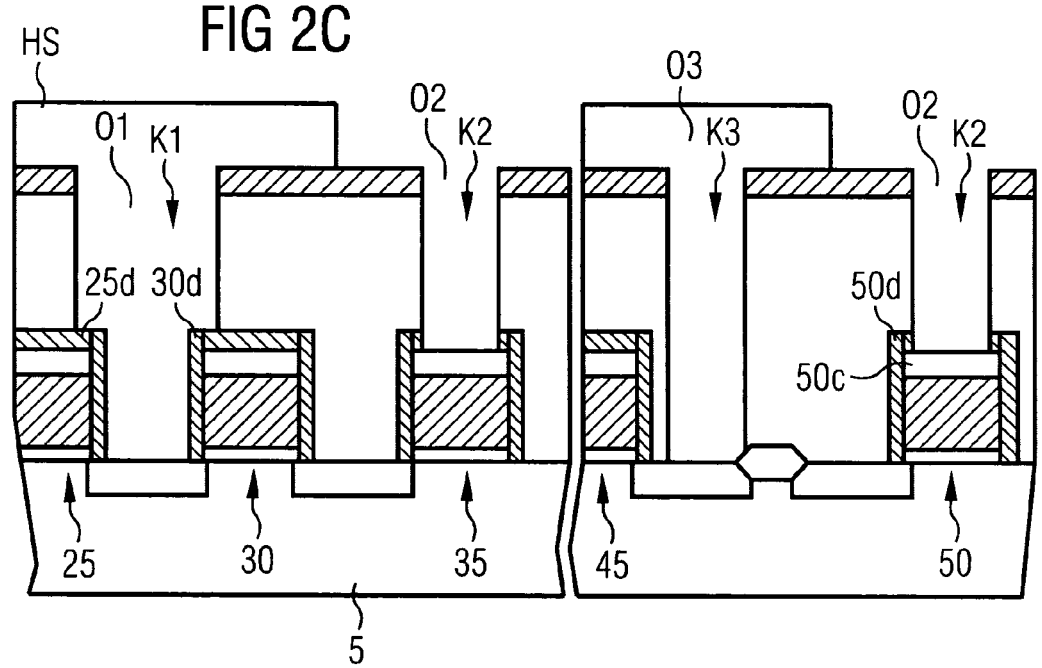
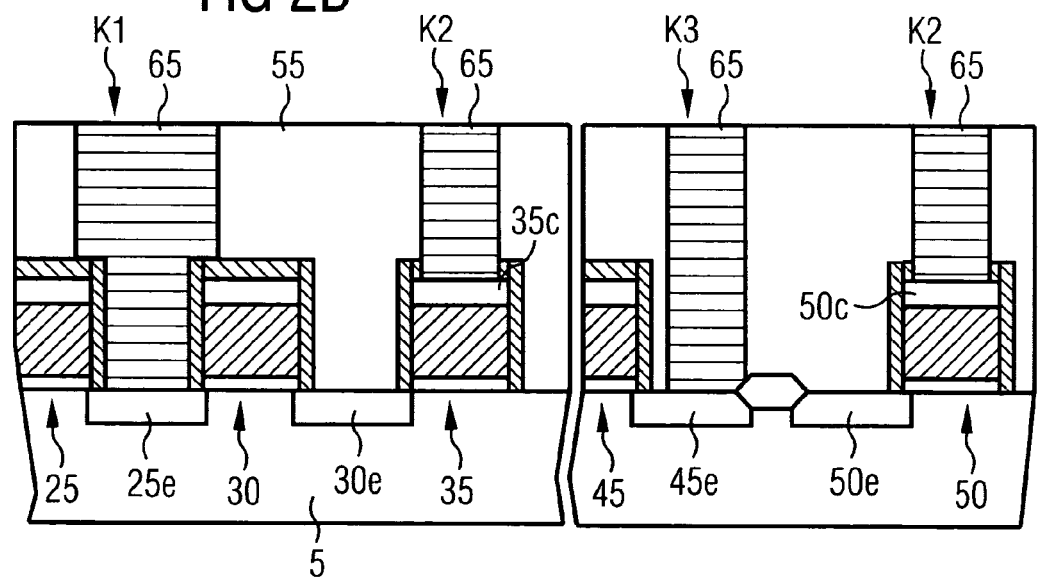

METHOD FOR THE FORMATION OF CONTACT HOLES FOR A NUMBER OF CONTACT REGIONS FOR COMPONENTS INTEGRATED IN A SUBSTRATE

CLAIM FOR PRIORITY

This application claims priority to PCT/EP02/03349, which was published in the German language on Dec. 19, 2002, which claims benefit to German Application No. 101 27 888.8, filed in the German language on Jun. 8, 2001.

TECHNICAL FIELD OF THE INVENTION

The invention relates to integrated circuits and a method of forming contact holes to a multiplicity of contact regions of components integrated in a substrate.

BACKGROUND OF THE INVENTION

In the fabrication of integrated circuits, electrical connections to the components integrated into a semiconductor substrate are required, which connections are generally formed by contact holes filled with a conductive material. In this case, firstly, a planar insulation layer is applied to the whole area of the semiconductor substrate and the contact holes are subsequently etched into the insulation layer.

The integrated components are, e.g., MOS transistors having a layer stack—arranged on the semiconductor substrate—comprising a gate electrode and a gate dielectric that insulates the gate electrode from the semiconductor substrate. The source/drain regions of the MOS transistor are situated laterally beside the layer stack in the semiconductor substrate. Contact is made with the MOS transistors at the gate electrode and also at the source/drain regions. In order to insulate the gate electrode, the layer stack is completely covered by a gate insulating layer, which may be composed, e.g., of silicon nitride. In order to establish an electrical contact, this insulating layer must be removed at least from the top side of the gate electrode.

Constant advances in the miniaturization of the integrated components mean that stringent requirements are imposed on the precise positioning of the contact holes. In order to meet these requirements, a lithography with the highest possible resolution must be used. Lithography mask structures of a projection mask are projected onto a radiation-sensitive layer on the semiconductor substrate and the layer is subsequently developed in order to remove the irradiated regions of the radiation-sensitive layer. A mask is produced from the radiation-sensitive layer as a result. Problems in the lithography are posed by the positioning of the projection mask that is to be introduced for imaging with respect to structures already present on the semiconductor substrate, since, for example, the contact holes are intended to be positioned with respect to their contact regions. Errors resulting from misalignment of the projection mask can be partially compensated for, however, during the subsequent etching of the contact holes. The different etching properties of the materials of the individual structures already situated on the semiconductor substrate are utilized in this case. Such a possibility will be described in more detail below with reference to the formation of contact holes to the source/drain regions.

When forming contact holes to the source/drain regions of a MOS transistor, it can happen that the openings formed in the etching mask are not arranged exactly above the source/drain regions, but rather slightly displaced laterally from the regions. In this case, the contact holes to be etched would likewise be laterally displaced with respect to the source/drain regions and uncover adjacent structures, which is undesirable under certain circumstances. In this case, it may be problematic, for example, if the gate insulating layer is removed and the gate electrode is thereby uncovered. However, provided that the etching method used for forming the contact holes is effected in such a way that the material of the insulation layer to be etched is etched selectively with respect to the material insulating layer of the mask and the gate insulating layer of the layer stack, then the gate insulating layer remains on the layer stack and thus protects the gate electrode during etching so that the gate electrode is not uncovered. The contact holes formed in the process directly adjoin the gate insulating layer of the layer stack, which is why this type of contact is also referred to as "borderless". Such borderless contacts are used quite deliberately in cell arrays of semiconductor memories, because the individual layer stacks of the MOS transistors are closely adjacent and have the minimum spacing that can be achieved lithographically.

As already indicated, however, it is also necessary to make contact with the gate electrode. To that end, it is necessary to introduce a contact hole into the insulation layer covering the layer stack and to remove the gate insulating layer covering the gate electrode. It has not been possible thus far to simultaneously fabricate both contact holes, since the gate insulating layer has to be removed in the contact hole to the gate electrode, but is intended to be preserved in the contact hole to the source/drain regions. Therefore, it has been customary to use two masks that, during the formation of one kind of contact hole, cover the other respective one. In order to meet the required accuracies in the formation of the contact holes, these two masks must be fabricated using the same high-resolution lithography. However, the second lithography step that is required means that the probability of errors also increases. Furthermore, each high-resolution lithography step contributes to increasing the expense of the integrated circuit.

In order to alleviate this problem, in the method described in U.S. Pat. No. 5,792,703, an insulation layer is applied to the semiconductor substrate provided with the integrated components and borderless contacts to the source/drain regions in a cell array of a semiconductor memory are produced in the insulation layer by means of a lithography with a lower resolution. On account of the configuration of the etching method described above, the contacts produced by the lithography with a lower resolution are self-aligned with respect to the layer stacks, so that, despite the relatively large cross sections of the contact holes (the lithography with a lower resolution leads to larger structures), the contact to the source/drain regions is established. After the contact holes produced in this way have been filled with polysilicon, a second insulation layer is applied to the filled contact holes and the insulation layer and contact holes to the contacts that have already been filled with polysilicon and also to the gate electrodes of the layer stacks are subsequently produced using a high resolution lithography, to comply with the required accuracy for the contacts to the gate electrodes in this case. Consequently, the method of U.S. Pat. No. 5,792,703 manages with only one high-resolution lithography. However, relatively stringent requirements with regard to the alignment of the mask must also be imposed on the lithography with a lower resolution used in that case, since only a small offset of the mask can be tolerated on account of the relatively closely adjacent structures in the cell array of the semi-conductor memory. Moreover, it is disadvantageous that two patterning masks are used, because both masks produce structures that remain on the semiconductor substrate, which possibly have a lateral offset with respect to one another. This can have an adverse effect in particular when masks of subsequent lithography steps have to be aligned with both structural planes.

In this context, high-resolution lithography is understood to mean a lithography that enables the smallest structures that can be achieved by the technology. Alignment and imaging errors have a significantly more pronounced effect in the case of high-resolution lithography than in the case of a lithography with a lower resolution. Therefore, the requirements and the error sensitivity are lower in the case of lithography with a lower resolution, and thus so are the associated costs due to the lithography method. Since lithography methods are being developed further, the minimum feature size that can be achieved will also decrease. At present, for example, 0.13 Am is ""state of the art", and in the future it will become 0.1 Am or less. The minimum structures that can be achieved are larger in the case of a low-resolution lithography method than in the case of high-resolution lithography methods, so that only "coarser" structures can be produced with lower-resolution lithography methods.

Therefore, the present invention specifies a method for forming contact holes to a multiplicity of contact regions of components integrated in a substrate in which a second patterning mask can be dispensed with while the feature resolution remains the same.

The invention includes a method for forming contact holes to a multiplicity of contact regions of components integrated in a substrate, having the following steps:

- at least one insulation layer is applied over the whole area of the substrate having the integrated components;
- a mask with openings is applied to the insulation layer at the locations at which contact holes reaching as far as the contact regions are subsequently intended to be formed;
- the contact holes defined through the openings of the mask are etched using the mask so that, for fully completing the contact holes, at least two etching steps are carried out and an auxiliary layer is used at least in one of the two etching steps, which auxiliary layer is applied to the mask and covers only a portion of the openings, so that etching is effected only at the locations defined by the uncovered portions of the openings.

Accordingly, the invention utilizes a single mask that includes all of the openings for the contact holes leading to the contact regions. Accordingly, in contrast to U.S. Pat. No. 5,792,703, only one patterning mask is required. Consequently, in the method according to the invention, all of the contact holes are formed with a single common mask, with the result that all of the contact holes are thus also aligned with respect to one another. A possible misalignment of the two masks required in U.S. Pat. No. 5,792,703, and hence a misalignment of the contact holes that are to be formed is reliably avoided. In order to define the order of formation of the individual contact holes or the individual etching steps, an auxiliary layer is used in addition to the mask, which auxiliary layer covers individual openings and thus frees the uncovered openings for processing. As a result, the uncovered openings of the mask are selected, which, in the respective etching step, define the position of the contact holes to be formed. Only one lithography method with a low resolution is required for the patterning of the auxiliary layer.

Since only a single patterning mask is employed, a mask required for a different structural plane can be aligned uniformly with respect to all of the contact holes. Consequently, all of the contact holes are fully completed using the mask, and all of the contact holes reach as far as their respective contact regions and the contact regions are uncovered at the bottom of the contact holes.

Using the auxiliary layer opens up a degree of freedom for the method according to the invention with respect to the extent of the order in which, and the etching chemistry with which, the individual contact holes can be fabricated. Depending on the patterning of the auxiliary layer, that is to say depending on which openings in the mask it covers, individual openings are chosen, so that the partial or complete formation of contact holes is effected only at the uncovered openings.

Completion, according to the invention, means the complete formation of the contact holes as far as the uncovering of the respective contact regions. This also encompasses a two-stage or multi-stage etching of individual contact holes. A two-stage or multi-stage etching may be necessary, e.g., when the contact holes have to be etched through more than a single layer.

The method according to the invention provides etching of a portion of the contact holes that is carried out in two partial etching steps, the two partial etching steps corresponding to the at least two etching steps or one of the at least two etching steps being subdivided into two partial etching steps, and

- in the first partial etching step, the insulation layer is etched as far as a gate insulating layer covering the contact regions, and
- in the second partial etching step, the gate insulating layer is removed to uncover the contact regions, so that the contact holes penetrate through the insulation layer and the gate insulating layer and reach as far as contact regions situated beneath the gate insulating layer.

In the case of at least a portion of the contact holes, the etching is effected in two partial steps since the contact holes have to be etched through the insulation layer and a gate insulating layer covering the contact regions. In this case, the insulation layer and the gate insulating layer are generally composed of different material, with the result that the etching methods used for etching the individual materials have a mutually different etching chemistry. As a rule, the etching method of the first partial etching step for etching the insulation layer is performed selectively with respect to the gate insulating layer, so that the etching method of the first partial etching step stops on the gate insulating layer.

A further advantageous embodiment is distinguished by the fact that

- the substrate is a semiconductor substrate;
- the components integrated in the semiconductor substrate in each case have a layer stack covered with the gate insulating layer and the contact regions are arranged on the layer stack below the gate insulating layer and in the semiconductor substrate;
- first contact holes reaching as far as the semiconductor substrate are etched into the insulation layer at locations defined by first openings of the mask in a single etching step, the first contact holes being formed in a self-aligned manner with respect to the layer stack and such that they directly adjoin the latter, and the insulation layer being etched selectively with respect to the material of the mask and with respect to the material of the gate insulating layer of the layer stack, so that side regions of the layer stack are uncovered in the first contact holes in the process; and
- second contact holes reaching as far as contact regions situated on the layer stack are etched at the locations defined by second openings in the mask using the two partial etching steps, in which case, at least in the second partial etching step, in order to remove the uncovered gate insulating layer from the bottom of the second contact holes, the first contact holes are covered with the auxiliary layer or are filled with a material at least to an extent such that the layer stack side regions that have been uncovered are completely covered by the auxiliary layer or the material.

To protect the gate insulating layer of the layer stack, which is uncovered in the first contact holes, the first contact holes are filled with the auxiliary layer or a material to such an extent that the gate insulating layer that has been uncovered is reliably covered. As a result, the gate insulating layer in the first contact holes is reliably protected.

The first and second contact holes can be formed successively or jointly. If the second contact holes are formed after the formation of the first contact holes, the second contact holes can be etched selectively with respect to the material already filled into the first contact holes.

According to an embodiment of the invention, in addition to the first and second openings, the mask can have third openings at locations at which, in the insulation layer, third contact holes reaching as far as further contact regions—arranged in the semiconductor substrate—of the integrated components are intended to be formed, the third openings being produced together with the first and second openings during the common lithography step in the mask, and the third contact holes being etched together with the second contact holes into the insulation layer.

Consequently, the method according to the invention also enables further contact holes to be produced without additional masks.

The method according to the invention is advantageous in the formation of contact holes in the case of integrated components which are relatively closely adjacent to one another. In this case, the method according to the invention is characterized in that one portion of the integrated components is arranged in a first region of the semiconductor substrate and another portion of the integrated components is arranged in a second region of the semiconductor substrate, the layer stacks of the integrated components in the first portion being arranged at a smaller distance from one another than the layer stacks of the integrated components in the second portion;

the first contact holes are formed in the first region of the semiconductor substrate directly between two adjacent layer stacks and such that they directly adjoin the latter;

the third contact holes are formed in the second region of the semiconductor component; and the second contact holes are formed in both the first and the second region of the semiconductor component.

Such a case occurs, for example, in semiconductor memory components that have at least one cell array and a so-called logic array. Memory cells comprising a selection transistor and a storage capacitor are arranged in a regular arrangement in the cell array. Based on this regularity, the individual components can be arranged relatively close together. Moreover, regularly arranged structures are well suited for lithographic imaging, so that a comparatively high arrangement density of the integrated components is possible in the cell array. In contrast to this, the logic array has a less dense arrangement. Therefore, there is also more space available for forming the contact holes that reach as far as the semiconductor substrate and that need not necessarily be embodied as borderless contacts. Furthermore, it may be possible that the formation of borderless contacts is actually not possible due to the irregular arrangement compared with the cell array. In principle, however, it is also possible to form contact holes that are likewise spaced apart with respect to the layer stacks in the cell array at locations for which a dense arrangement of the integrated components is not available.

In a method according to the invention, during the etching of the first contact holes, the second openings or the second and third openings of the mask are covered by the auxiliary layer with the first openings being left uncovered, with the result that, after removal of the auxiliary layer, the second and, if appropriate, third contact holes can be formed together in the separate etching step. Accordingly, the auxiliary layer is applied to the mask before formation of the first contact holes and is removed before formation of the second and, if appropriate, third contact holes. The first contact holes are preferably filled with the auxiliary layer still present. This method according to the invention can also utilize material remaining in the first contact holes to perform the function of the auxiliary layer and serve as a selection mask.

According to the invention, a less demanding lithography compared with the lithography for the mask can be used for fabricating the openings that are to be introduced into the auxiliary layer. Since the auxiliary layer does not define any structures, but rather is intended to selectively cover individual openings of the mask, the openings of the auxiliary layer can be relatively large in comparison with the openings of the mask. It can therefore be beneficial to make the openings in the auxiliary layer so large that even in the event of a possible misalignment of the projection mask used for fabricating the auxiliary layer, the auxiliary layer does not cover the openings of the mask that are to be exposed. Moreover, a possible misalignment of the projection mask used for fabricating the auxiliary layer does not affect subsequent patterning steps, since the auxiliary layer does not define any permanent structures. The projection masks used in subsequent patterning steps can thus be aligned directly with the structures defined by the main mask.

In an embodiment of the invention, the mask comprises a first layer and a second layer covering the first layer, the second layer being comprising the same material as the gate insulating layer of the layer stacks. As a result, the etching method, in particular for forming the first contact holes, can be carried out highly selectively with respect to the material of the gate insulating layer.

Formation of the second and third contact holes is carried out selectively with respect to the material of the first layer of the mask. In this case, the second layer and the gate insulating layer uncovered at the bottom of the second contact holes can be removed simultaneously.

In an embodiment of the method according to the invention, the first, second and third contact holes are formed together in a common etching step, the gate insulating layer being uncovered in the second contact holes;

the first and third contact holes are subsequently covered with an auxiliary layer with the second contact holes being left uncovered; and the gate insulating layer, uncovered at the bottom the second contact holes, is removed by etching conducted selectively with respect to the material of the auxiliary layer and with respect to the material of the mask.

In this case, all of the contact holes are formed together and afterward the auxiliary layer is used to select the contact holes in which the gate insulating layer still has to be removed. Thus, the auxiliary layer likewise serves as a selection mask here.

The invention is explained in greater detail below using exemplary embodiments with reference to the figures in which:

FIGS. 2A-2D show individual method steps of a second exemplary embodiment;

Figure 1A:
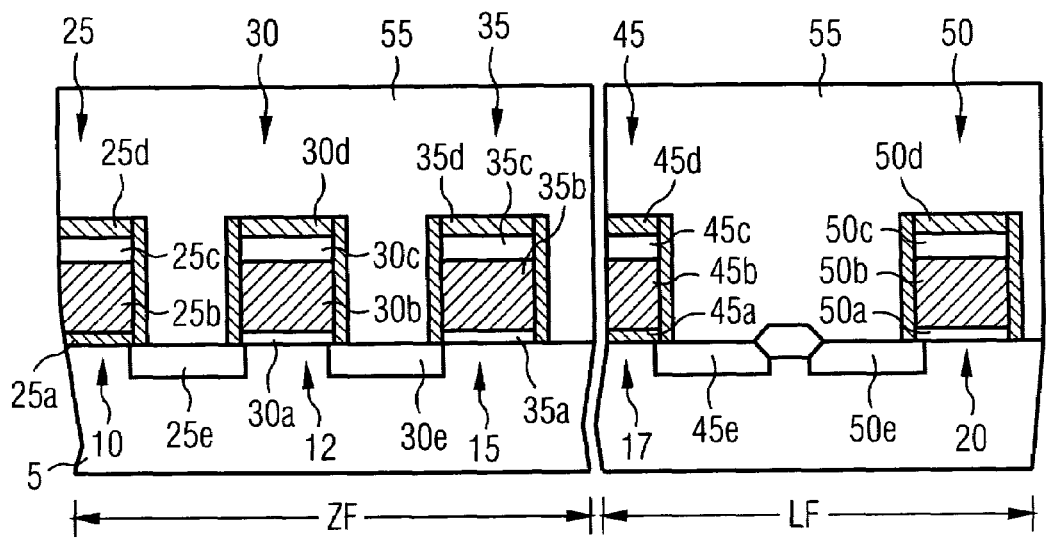
FIGS. 1A-1F show individual method steps of a first exemplary embodiment.

FIG. 1A illustrates a semiconductor component (integrated circuit) with a semiconductor substrate 5—comprising, e.g., crystalline silicon—with a multiplicity of integrated components 10, 12, 15, 17, 20. Planar MOS transistors are involved in the present case. Each of these transistors has a layer stack (gate stack) 25, 30, 35, 45 and 50, each layer stack has a gate oxide 25a, 30a, 35a, 45a, 50a, and a gate electrode 25b, 30b, 35b, 45b, 50b that preferably comprises polysilicon and, on the side remote from the semiconductor substrate 5, has a layer of tungsten silicide 25c, 30c, 35c, 35c, 45c, 50c for reducing the sheet resistance of the gate electrode and for improving the electrical contact that is formed. On its side walls and top side, each layer stack 25, 30, 35, 45, and 50 is covered by a gate insulating layer 25d, 30d, 35d, 45d, and 50d, which is preferably constructed in two parts. The gate insulating layer may comprise, for example, self-aligned edge webs and a layer covering the tungsten silicide layer 25c, 30c, 35c, 45c, 50c. The self-aligned edge webs (spacers) are formed by conformal deposition and anisotropic etching of a layer applied over the whole area. Preferably, the gate insulating layer comprises silicon nitride. The gate insulating layer 25d, 30d, 35d, 45d, 50d can also be constructed in one part. The tungsten silicide layer seated on the gate electrode forms contact regions 25c, 30c, 35c, 45c, 50c of the layer stacks.

Doping regions 25e, 30e, 45e, 50e extend in the semiconductor substrate between the individual transistors, the doping regions forming the source/drain regions of the transistors and, at the same time, the contact regions integrated into the semiconductor substrate 5.

As illustrated in FIG. 1A, the layer stacks are arranged closer together in the left-hand half of the figure than in the right-hand half of the figure. The left-hand half of the figure represents a first region ZF of the semiconductor component, which represents a cell array of a semiconductor memory. In contrast, the right-hand half of the figure represents a detail of a second region LF of the same semiconductor component, in which the layer stacks have a larger spacing from one another. The second region LF is, e.g., the logic array (also called periphery) that is required for addressing the cell array. Consequently, this semiconductor component, which is illustrated by way of example, is a dynamic semiconductor memory (DRAM).

Figure 1B:
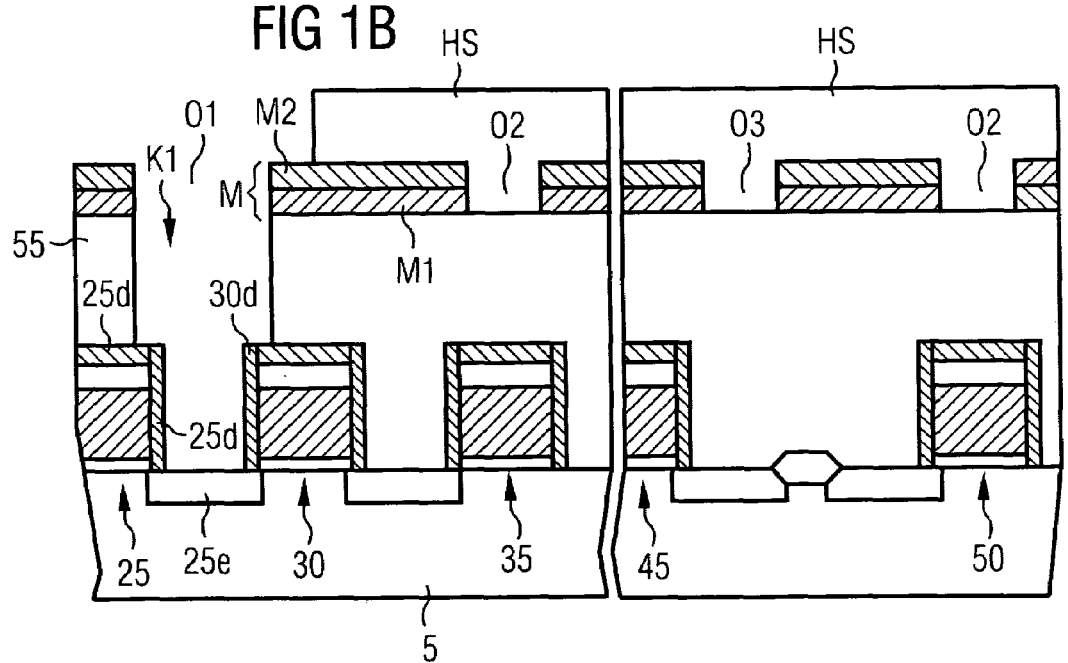

In fabricating individual contact holes, a planarizing insulation layer 55, preferably made of an oxide, is applied to the semiconductor substrate 5 having transistors 10, 12, 15, 17, 20. Afterward, as illustrated in FIG. 1B, a mask M comprising a first and a second layer M1 and M2 is applied. Preferably, the first layer M1 comprises polysilicon and the second layer M2 comprises silicon nitride. The mask M is preferably formed as a hard mask, from a material that has significantly greater thermostability than a photoresist. Polysilicon and silicon nitride have significantly greater thermostability than a photoresist.

The mask M has openings 01, 02, 03 at the locations at which the first, second, and third contact holes K1, K2, and K3 are intended to be formed. In this case, the first contact holes K1 make contact with the source/drain regions in the first region (cell array ZF), the third contact holes make contact with the source/drain regions (logic array LF) and the second contact holes make contact both in the first and in the second region ZF, LF of the semiconductor component.

To fabricate the openings 01, 02, and 03 in the mask M, u relatively high-resolution lithography is used to obtain the required accuracy. This may be, e.g., a lithography using ultraviolet light. The lithography necessary for achieving the required accuracy should be employed in each case, that is to say, a lithography enabling the contact holes to be placed with sufficient accuracy with regard to the structures already present (layer stacks, doping regions). The openings of the mask M themselves are formed by applying, e.g., a photoresist, patterning the photoresist using lithography, developing the photoresist to remove the exposed regions of the photoresist that define the openings, and etching the first and second layers M1, M2 using the patterned photoresist.

An auxiliary layer HS preferably comprises a photo-sensitive resist that is applied to the mask M and patterned in such a way that the auxiliary layer HS leaves the first openings 01 uncovered for forming the first contact holes K1, but covers the second and third openings 02 and 03. A lithography that is less accurate compared with the lithography of the mask M is suitable for forming the opening in the auxiliary layer HS. The requirements imposed on the accuracy of the lithography of the auxiliary layer HS are significantly less critical, because larger openings are intended to be formed in the auxiliary layer in comparison with the mask M.

Using the double mask M and auxiliary layer HS, the first contact holes K1 are subsequently etched into the insulation layer 55, in which case the etching of the insulation layer should be effected selectively with respect to silicon nitride and the photosensitive resist of the auxiliary layer HS. This can be achieved, for example, by etching gases $C_5F_8$ and $O_2$. The etching is carried out until the doping regions situated in the semiconductor substrate are uncovered. Due to the etching, which is carried out selectively with respect to silicon nitride, the gate insulating layer 25d and 30d is not removed in the first contact holes K1, so that the first contact holes are formed in a self-aligned manner with respect to, and directly adjoining, the layer stacks 25 and 30 situated there. This is effected when the cross section, as can be seen in FIG. 1B, of the first contact holes is larger than the distance between two directly adjacent layer stacks.

Figure 1C:
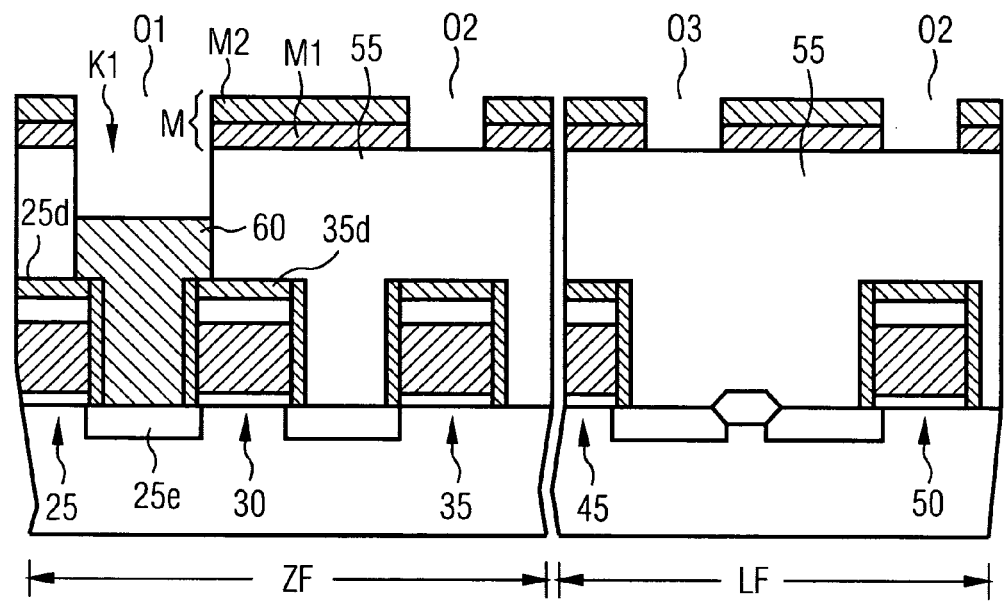

In a subsequent step, conductive material 60 is filled into the first contact holes K1. This is preferably effected with the auxiliary layer HS still present. Polysilicon, in particular, is suitable as conductive material 60 since good electrical contact with the doping regions can be established therewith. After the filling and, if appropriate, etching of the polysilicon (etching should only be effected to an extent that the gate insulating layer 25d and 30d remains completely covered in the first contact holes), the auxiliary layer HS is removed for example by incineration. FIG. 1C shows the semiconductor component after this step.

Figure 1D:
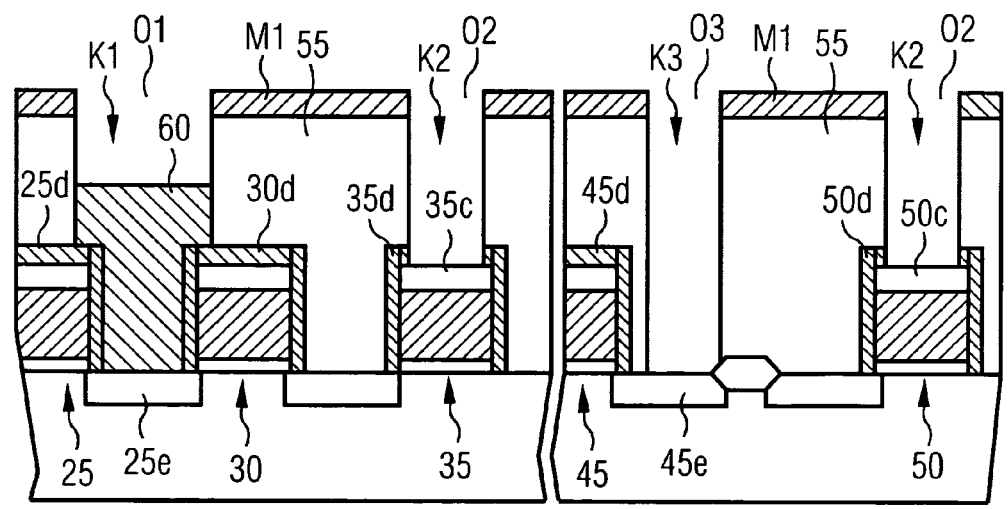
Figure 1E:
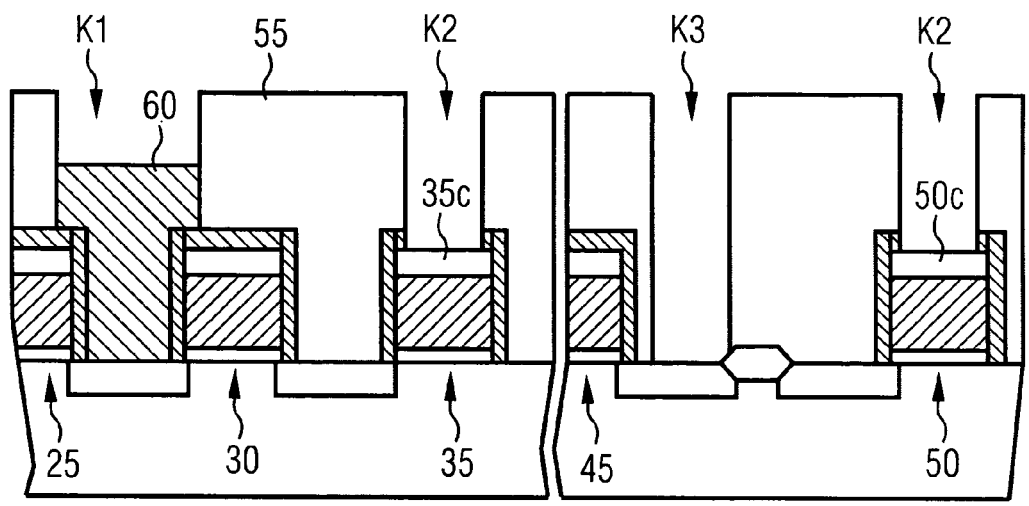
Figure 1F:
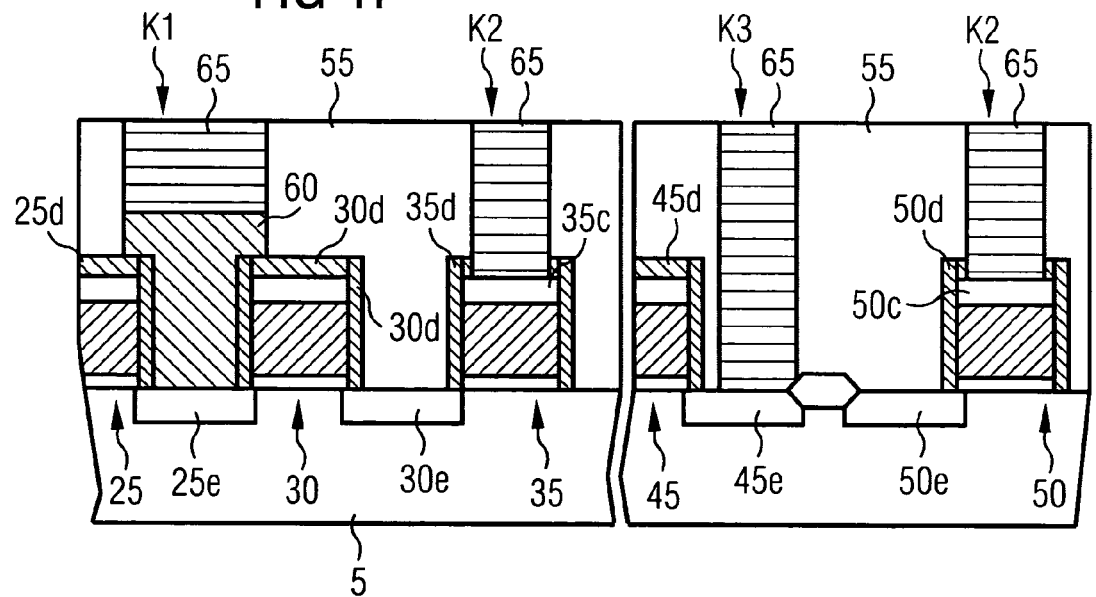

Afterward, as shown in FIG. 1D, the insulation layer 55 is etched selectively with respect to the material (polysilicon in the present case) of the first layer M1. The second and third contact holes K2 and K3 are produced in the process. It is favorable if silicon nitride, the material of the second mask layer M2, is also removed at the same time as the etching of the insulation layer 55. This is because an additional etching step can thus be dispensed with. At the same time, the gate insulating layer 35d and 50d is also removed in the third contact holes K3 and the tungsten silicide layer 35c and 50c serving as contact regions is thus uncovered. A suitable etching method for etching the insulation layer 55—comprising, for example, silicon oxide—and also silicon nitride selectively with respect to polysilicon, can be effected, for example, using the etching gases $CHF_3$ and $CF_4$ or $C_4F_6$ or $C_4F_8$, and also $C_5F_8$. Finally, the first mask layer M1 is removed in accordance with FIG. 1E.

Lastly, the contact holes K1, K2, and K3 are filled with a further conductive material 65, for example tungsten. However, it is also possible for this not to be effected until in the context of the formation of the first metallization plane. This modification is illustrated by way of example in FIG. 4, where it can be seen that trenches 70 connecting individual contact holes have been introduced into the insulation layer 55 and then, together with the contact holes K1, K2, and K3, have been filled with tungsten. Before the contact holes are filled with tungsten, a thin titanium nitride or titanium/titanium nitride deposition with subsequent thermal treatment is preferably carried out in order to reduce the contact resistance with respect to the silicon substrate 5. During the thermal treatment, titanium silicide is produced at the bottom of the contact holes and forms a good ohmic contact with the silicon substrate 5. The titanium/titanium nitride layer which has not been converted into silicide can be removed selectively.

Figure 4:
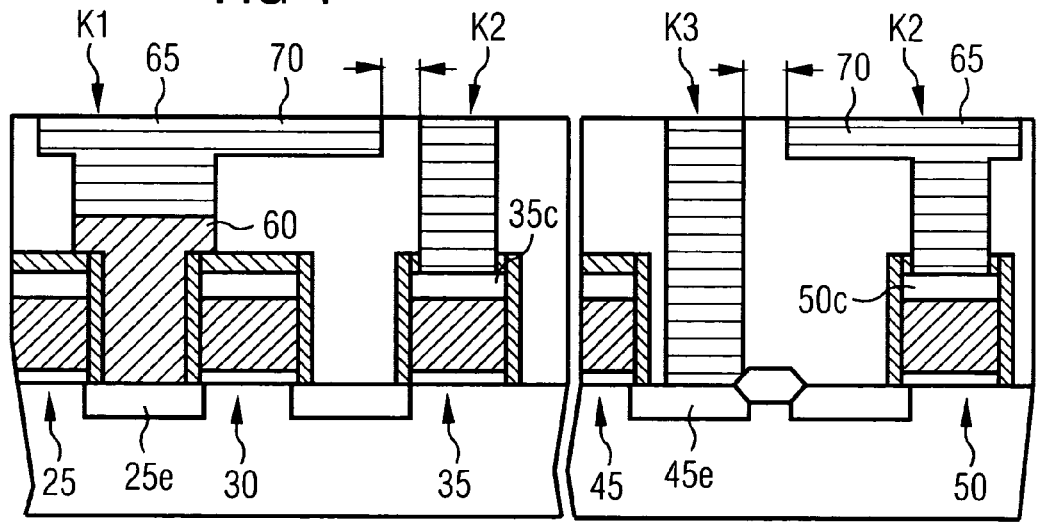
FIG. 4 shows a semiconductor component provided with a metallization.

FIG. 4 furthermore illustrates the alignment of the trenches 70 relative to the contact holes. A lithography of the highest possible resolution is preferred in the fabrication of the trenches 70. The projection mask used in this case can be aligned directly with respect to the contact holes. Since only one patterning mask (here mask M) is used, according to the invention, all of the contact holes are aligned with respect to one another. An offset that may occur when using a plurality of patterning masks is thus precluded according to the invention.

A further exemplary embodiment of the method according to the invention is shown in FIGS. 2A to 2D. The starting point in this embodiment is a semiconductor substrate that is provided with integrated semiconductor components and corresponds to that of FIG. 1A. An insulation layer 55 is applied to the substrate. However, the mask M that is then deposited onto the insulation layer comprises only one mask layer M1, which preferably comprises polysilicon. The mask M has all the openings necessary for forming the contact holes.

Using the mask M, the insulation layer 55 is etched selectively with respect to the material of the mask M (preferably polysilicon) and with respect to the material of the gate insulating layer of the layer stacks (preferably silicon nitride), in the course of which the first, second, and third contact holes K1, K2, and K3 are formed. On account of the selectivity, the etching stops on the doping regions 25e and 45e and on the gate insulating layer 35d and 55d.

Afterward, in accordance with FIG. 2C, an auxiliary layer HS is applied to the mask M, which, except for the second contact holes K2, covers all of the remaining contact holes. As a result, the second contact holes K2 are selected for etching of the gate insulating layer 35d and 50d that is exposed.

After the removal of the auxiliary layer HS and the mask M, all of the contact holes are filled with a conductive material 65, preferably tungsten, and planarized.

A comparison of the first and second exemplary embodiments reveals that, in the first exemplary embodiment, the first contact holes K1 can be filled with a different material than the second and third contact holes K2 and K3. This is advantageous when the logic array requires a different contact construction than the cell array. In the second exemplary embodiment, there is such a selection possibility with regard to filling materials for the second contact holes K2 in comparison with the first and third contact holes K1 and K3, provided that the second contact holes K2 are filled with a conductive material before the removal of the auxiliary layer HS.

Figure 3:
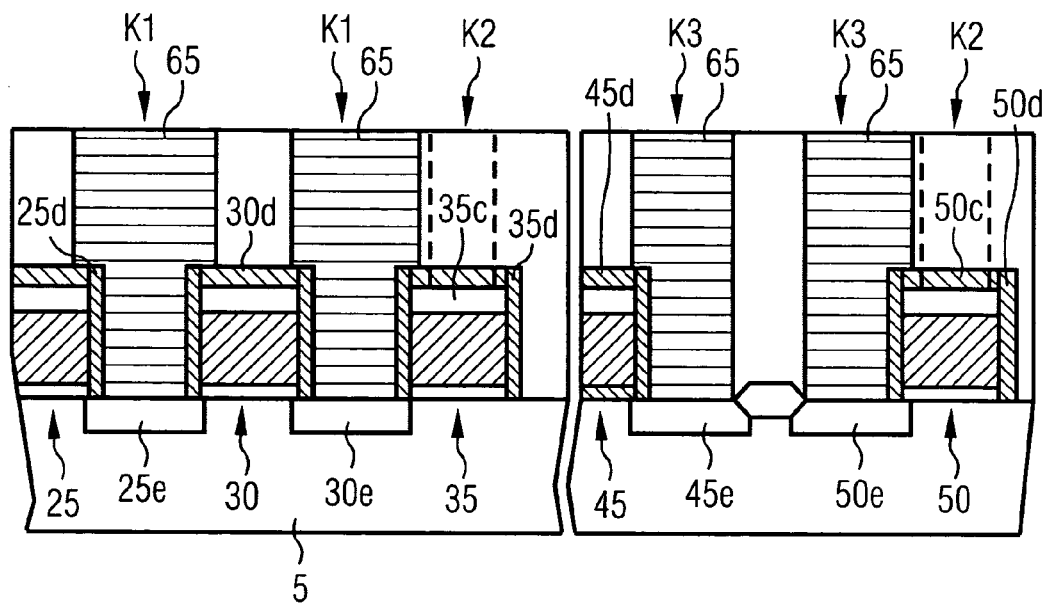
FIG. 3 shows a semiconductor component fabricated by the method according to the invention.

As illustrated in FIG. 3, the third contact holes K3 can, at least in part, also be embodied as borderless contacts. Since borderless contacts take up less space, it is possible to reduce the size of the doping regions and thus the transistors in the logic array. If a possible misalignment of the projection mask used for forming the openings in the mask M causes the contact holes to be displaced laterally toward the doping regions 45e and 50e, this lateral offset of the third contact holes K3 is compensated for by their self-aligned formation with regard to the layer stacks 45 and 50.

In FIG. 3, the second contact holes K2 are shown in a different plane than the first and third contact holes K1 and K3, which are situated in the plane of the drawing. After the removal of the auxiliary layer HS and the mask M, all of the contact holes are filled with a conductive material 65, preferably tungsten, and planarized.

A comparison of the first and second exemplary embodiments reveals that, in the first exemplary embodiment, the first contact holes K1 can be filled with a different material than the second and third contact holes K2 and K3. This is advantageous when the logic array requires a different contact construction than the cell array. In the second exemplary embodiment, there is such a selection possibility with regard to filling materials for the second contact holes K2 in comparison with the first and third contact holes K1 and K3, provided that the second contact holes K2 are filled with a conductive material before the removal of the auxiliary layer HS.

As illustrated in FIG. 3, the third contact holes K3 can, at least in part, also be embodied as borderless contacts. Since borderless contacts take up less space, it is possible to reduce the size of the doping regions and thus the transistors in the logic array. If a possible misalignment of the projection mask used for forming the openings in the mask M causes the contact holes to be displaced laterally toward the doping regions 45e and 50e, this lateral offset of the third contact holes K3 is compensated for by their self-aligned formation with regard to the layer stacks 45 and 50.

In FIG. 3, the second contact holes K2 are shown in a different plane than the first and third contact holes K1 and K3, which are situated in the plane of the drawing.

The invention claimed is:

1. A method of manufacturing an integrated circuit comprising contact holes to contact regions of components formed in a semiconductor substrate, comprising:
   forming an insulation layer over the semiconductor substrate-comprising components, wherein the components comprise a layer stack covered with a insulating layer, and first contact regions are arranged on the layer stack below the insulating layer and second contact regions are arranged in the semiconductor substrate;
   forming a mask with openings over the insulation layer, wherein the mask comprises a first layer and a second layer covering the first layer, the second layer being comprised of a same material as the insulating layer of the layer stacks;
   defining the contact holes through the openings of the mask and etching using the mask, wherein at least two etching steps are carried out and an auxiliary layer is used at least in one of the two etching steps, which auxiliary layer is applied to the mask and covers only a portion of the openings.

2. The method as claimed in claim 1, wherein when utilizing two etching steps to define the contact holes, the insulation layer is etched and the insulating layer remains covering the contact regions, and
in the second partial etching stop the insulating layer is removed to uncover the contact regions, so that the contact holes formed there penetrate through the insulation layer and the insulating layer and expose contact regions beneath the insulating layer.

3. The method as claimed in claim 2, wherein the substrate is a semiconductor substrate;
first contact holes reaching as far as the semiconductor substrate are etched into the insulation layer at the locations defined by first openings of the mark in a single etching step, the first contact holes being formed in a self-aligned manner with respect to the layer stacks and such that they directly adjoin the latter, and the insulation layer being etched selectively with respect to the material of the mask and with respect to the material of the insulating layer, so that side regions of the layer stacks are uncovered in the first contact holes; and
second contact holes reaching as far as contact regions situated on the layer stacks are etched at locations defined by second openings in the mask using two partial etching steps, in which case, at least in the second partial etching step, in order to remove the uncovered insulating layer from the bottom of the second contact holes, the first contact holes are covered with the auxiliary layer or are filled with a material at least to an extent such that the layer stack side regions are completely covered by the auxiliary layer or the material.

4. The method as claimed in claim 3, wherein, in addition to the first and second openings, the mask has third openings at the locations at which, in the insulation layer, third contact holes reaching as far as further contact regions are to be formed, the third contact holes being etched together with the second contact holes into the insulation layer.

5. The method as claimed in claim 4, wherein a portion of the integrated components is arranged in a first region of the semiconductor substrate and another portion of the integrated components is arranged in a second region of the semiconductor substrate, the layer stacks of the integrated components in the first portion being arranged at a smaller distance from one another than the layer stacks of the integrated components in the second portion;
the first contact holes are formed in the first region of the semiconductor substrate directly between two adjacent layer stacks and such that they directly adjoin the latter;
the third contact holes are formed in the second region of the semiconductor substrate; and
the second contact holes are formed in both the first and the second region of the semiconductor substrate.

6. The method as claimed in claim 3, wherein, during etching of the first contact holes, the second openings of the mask are covered by the auxiliary layer, with the first openings being left uncovered, and, after removal of the auxiliary layer, the second contact holes are formed in a subsequent separate etching step.

7. The method as claimed in claim 4, wherein during etching of the first contact holes, the second and third openings of the mask are covered by the auxiliary layer, with the first openings being left uncovered, and, after the removal of the auxiliary layer, the second and third contact holes are formed in a separate etching step.

8. The method as claimed in claim 1, wherein the second layer of mask and the insulating layer comprise predominantly silicon nitride.

9. The method as claimed in claim 1, wherein the second and third contact holes are formed by an etching conducted selectively with respect to the material of the first layer of the mask and in which, at the same time, the insulating layer uncovered at the bottom of the second contact holes and the second layer of the mask are removed.

10. The method as claimed in claim 1, wherein the first layer of the mask comprised predominantly polysilicon.

11. The method as claimed in claim 3, wherein a conductive material fills the first contact holes and comes into electrical contact with the contact regions uncovered at the bottom of the first contact holes.

12. The method as claimed in claim 11, wherein the conductive material comprises polysilicon.

13. The method as claimed in claim 11, wherein the first contact holes, which are partially filled with the conductive material, and also the second and third contact holes are completely filled with a further electrically conductive material for making electrical contact with the first, second, and third contact regions.

14. The method as claimed in claim 13, wherein the further electrically conductive material comprises predominantly tungsten.

15. The method as claimed in claim 4, wherein
the first, second, and third contact holes, are formed in a common etching step, the insulating layer being uncovered upon formation of the second contact holes;
the first and third contact holes are covered by the auxiliary layer; and
the insulating layer, is removed by etching that is conducted selectively with respect to the material of the auxiliary layer and with respect to the material of the mask.

16. The method as claimed in claim 15, wherein, after removal of the insulating layer from the bottom of the second contact holes, the auxiliary layer is removed and the first, second, and third contact holes are filled with an electrically conductive material which comes into electrical contact with the contact regions of the first, second, and third contact holes.

17. The method as claimed in claim 16 wherein the electrically conductive material comprises predominantly tungsten.

18. The method as claimed in claim 4, wherein the third contact holes are self-aligned with respect to the layer stacks, directly adjoining the latter, and extend to as the semiconductor substrate.

19. The method as claimed in claim 1, wherein the layer stacks comprise a gate oxide, above which is located a gate electrode comprising polysilicon with a tungsten silicide layer, the layer stacks being covered by the insulating layer.

20. The method as claimed in claim 1, wherein the insulation layer comprises an oxide.

21. The method as claimed in claim 1, wherein
the openings of the mask are produced in a first lithography; and
the auxiliary layer is patterned by a second lithography, the feature resolution of the first lithography being higher than that of the second lithography.

22. The method as claimed in claim 1, wherein the auxiliary layer comprises a photoresist.

* * * * *